(12) United States Patent
Lee et al.

(10) Patent No.: US 11,735,436 B2
(45) Date of Patent: *Aug. 22, 2023

(54) SEMICONDUCTOR FABRICATION APPARATUS

(71) Applicant: TAIWAN SEMICONDUCTOR MANUFACTURING COMPANY LIMITED, Hsin-Chu (TW)

(72) Inventors: Chih-Tsung Lee, Hsinchu (TW); Sheng-Chun Yang, Tainan (TW); Yun-Tzu Chiu, Hsinchu (TW); Chao-Hung Wan, Taichung (TW); Yi-Ming Lin, Tainan (TW); Chyi-Tsong Ni, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/885,235

(22) Filed: Aug. 10, 2022

(65) Prior Publication Data
US 2022/0392782 A1  Dec. 8, 2022

Related U.S. Application Data

(63) Continuation of application No. 17/002,874, filed on Aug. 26, 2020, now Pat. No. 11,443,961.

(60) Provisional application No. 62/894,669, filed on Aug. 30, 2019.

(51) Int. Cl.
*H01L 21/67* (2006.01)
*B65G 47/90* (2006.01)
*H01L 21/687* (2006.01)

(52) U.S. Cl.
CPC ........ *H01L 21/67017* (2013.01); *B65G 47/90* (2013.01); *H01L 21/67167* (2013.01); *H01L 21/67196* (2013.01); *H01L 21/68707* (2013.01)

(58) Field of Classification Search
CPC .......... H01L 21/67; H01L 21/68; F27B 15/08; F27B 15/09
USPC ............................................. 261/19, 65, 79.1
See application file for complete search history.

(56) References Cited

U.S. PATENT DOCUMENTS 6,251,195 B1   6/2001  Wagener et al.
6,672,864 B2 *  1/2004  Wang ................ H01L 21/67017
                                                  414/217

* cited by examiner

*Primary Examiner* — Ronald P Jarrett
(74) *Attorney, Agent, or Firm* — Cooper Legal Group, LLC

(57) ABSTRACT

An apparatus for fabricating a semiconductor device has a housing defining a buffer chamber, a plurality of reactor ports formed in the housing for establishing interfaces with a plurality of process chambers that are to receive a wafer during a fabrication process to fabricate the semiconductor device, a wafer positioning robot positioned within the buffer chamber to transport the wafer between the plurality of process chambers through the plurality of reactor ports, a purge port formed in the housing for introducing a purge gas into the buffer chamber, a pump port formed in the housing for exhausting a portion of the purge gas from the buffer chamber, and a first flow enhancer that directs the purge gas flowing in an axial direction along a longitudinal axis of the purge port into the buffer chamber in a plurality of radial directions relative to the longitudinal axis.

20 Claims, 11 Drawing Sheets

SEMICONDUCTOR FABRICATION APPARATUS

CROSS-REFERENCE TO RELATED APPLICATIONS

This application is a continuation of U.S. Non-Provisional application Ser. No. 17/002,874, filed Aug. 26, 2020, which claims the benefit of U.S. Provisional Application No. 62/894,669, filed Aug. 30, 2019. U.S. Non-Provisional application Ser. No. 17/002,874 and U.S. Provisional Application No. 62/894,669 are incorporated in their entireties herein by reference.

BACKGROUND

Semiconductor devices, such as transistors, are used in a multitude of electronic devices, such as mobile phones, laptops, desktops, tablets, watches, gaming systems, and various other industrial, commercial, and consumer electronics. A semiconductor wafer generally undergoes one or more treatments to produce semiconductor devices on, in, and/or from the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
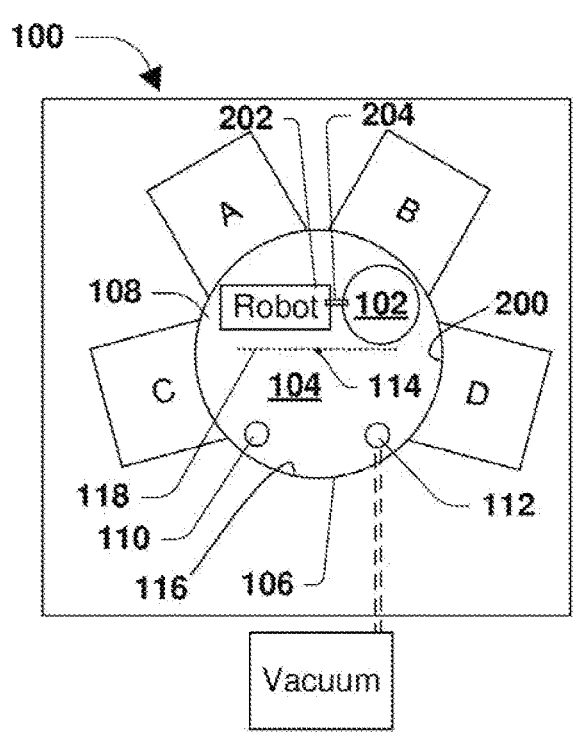
FIG. 1 illustrates an apparatus for fabricating a semiconductor device, comprising an asymmetrical arrangement of a pump port and a purge port in accordance with some embodiments.

Aspects of the present disclosure are best understood from the following detailed description when read with the accompanying Figs. It is noted that, in accordance with the standard practice in the industry, various features are not drawn to scale. In fact, the dimensions of the various features may be arbitrarily increased or reduced for clarity of discussion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the Figs. The spatially relative terms are intended to encompass different orientations of the device in use or operation in addition to the orientation depicted in the Figs. The apparatus may be otherwise oriented (rotated 90 degrees or at other orientations) and the spatially relative descriptors used herein may likewise be interpreted accordingly.

During fabrication of a semiconductor device on a wafer, the wafer is transported between a plurality of process chambers. Some embodiments provided herein thus relate to an apparatus for fabricating a semiconductor device. For example, the apparatus comprises a housing defining a buffer chamber, and a plurality of reactor ports formed in the housing for establishing interfaces with a plurality of process chambers that are to receive a wafer during a fabrication process to fabricate the semiconductor device. According to some embodiments, a wafer positioning robot is positioned, at least partially, within the buffer chamber to transport the wafer between the plurality of process chambers through the plurality of reactor ports. The wafer is subjected to different processes in the different process chambers so that, among other things, one or more layers can be added, removed, treated, etc. in, on, from, to, etc. the wafer in the different process chambers.

Some embodiments comprise a purge port formed in a portion of the housing for introducing a purge gas into the buffer chamber, and a pump port formed in a portion of the housing for exhausting a portion of the purge gas from the buffer chamber. The purge gas can be an inert gas or other gas that does not react with the materials deposited onto the wafer. Examples of the purge gas include, but are not limited to Helium, Nitrogen, combinations thereof, etc. According to some embodiments, the purge port and the pump port can be arranged in a symmetrical arrangement relative to a center of the buffer chamber. According to some embodiments, the purge port is defined in a floor of the housing, and pump port is arranged approximately one hundred eighty degrees (180°) about the center of the floor relative to the purge port. A purge gas introduced into the buffer chamber through the purge port permeates the buffer chamber and is at least partially evacuated from the buffer chamber through the pump port.

According to some embodiments, a first flow enhancer is arranged adjacent to, and optionally concentric with the purge port. The flow enhancer directs the purge gas flowing in an axial direction along a longitudinal axis of the purge port into the buffer chamber in a plurality of radial directions relative to the longitudinal axis. Some embodiments involve the purge gas flowing in a linear direction through the purge port, such as a laminar flow. The purge gas encounters the flow enhancer as the purge gas enters the buffer chamber. As a result of this encounter, the purge gas is forced to travel around the flow enhancer, changing direction in the process.

In some embodiments the first flow enhancer comprises a frame that supports a first cap at a first elevation vertically above the purge port formed in the floor. Some embodiments of the first cap comprise a circular footprint, and a ratio of a radius of the circular footprint of the first cap to a height of the frame fall within a range from about 1.0, up to about 4.0.

Some embodiments of the frame of the first flow enhancer support a second cap at a second elevation vertically between the purge port and the first cap. According to some embodiments, the second cap can comprise a circular footprint, and a ratio of a radius of the circular footprint of the second cap to a height of the frame can fall within a range from about 0.25, up to about 1.5. Some embodiments of the purge port can comprise an arcuate wall defining a circular aperture, and the second cap can comprise a circular footprint. A ratio of a radius of the circular footprint of the second cap to a radius of the circular aperture of the purge port can fall within a range from about 0.5, up to about 5. For embodiments where the first cap and the second cap comprise circular footprints, a ratio of a radius of the circular footprint of the first cap to a radius of the circular footprint of the second cap can fall within a range from about 1.5, up to about 5.

According to some embodiments, a second flow enhancer is arranged adjacent to, and optionally concentric with the pump port, wherein the second flow enhancer directs a portion of the purge gas drawn into the pump port from the buffer chamber in a radial direction relative to a longitudinal axis of the pump port, before the portion of the purge gas drawn into the pump port travels in an axial direction along the longitudinal axis of the pump port.

Some embodiments involve a method of promoting uniform distribution of a purge gas in a buffer chamber. For example, a flow of the purge gas into the buffer chamber is established in a first axial direction along a longitudinal axis of a purge port formed in a floor defining the buffer chamber. According to some embodiments, a first flow enhancer is used to direct the purge gas entering the buffer chamber in the first axial direction to a plurality of radial directions extending generally away from the longitudinal axis of the purge port.

According to some embodiments, a partial vacuum at a pump port formed in the floor defining the buffer chamber draws a portion of the purge gas from the buffer chamber. A second flow enhancer directs the portion of the purge gas being drawn from the buffer chamber in a radial flow direction toward a longitudinal axis of the pump port to enter the pump port. For some embodiments, the portion of the purge gas being directed in the radial flow direction is redirected to flow through the pump port in a second axial direction along the longitudinal axis of the pump port. According to some embodiments, an effect of at least one of the relative arrangement of the purge port and the pump port, the first flow enhancer, or the second flow enhancer is to promote uniform distribution of the purge gas throughout the buffer chamber.

Turning to the drawings, FIG. 1 illustrates an apparatus 100 for manufacturing a semiconductor device on a wafer 102. The embodiment of the apparatus 100 shown in FIG. 1 comprises a buffer chamber 104 defined by a housing 106. A floor 108 of the housing 106 comprises a surface within which is defined at least one of a purge port 110 or a pump port 112. A purge gas is introduced into the buffer chamber 104 through the purge port 110. The pump port 112 can be in fluid communication with a vacuum source, to establish a partial vacuum at the pump port 112 within the buffer chamber 104, to draw and exhaust a portion of the purge gas from the buffer chamber 104 through the pump port 112. Examples of the purge gas include at least one of an inert gas or other gas, such as Helium, Nitrogen, combinations thereof, etc., that does not react with one or more materials deposited onto the wafer 102.

In some embodiments, the purge port 110 and the pump port 112 are in an asymmetrical arrangement relative to a center 114 of the buffer chamber 104. For example, the floor 108 can be circular, surrounded by an arcuate peripheral wall 116. Some embodiments of the center 114 of the buffer chamber 104 are located at the mathematical origin, about which the arcuate peripheral wall 116 extends at a fixed radial distance from the center 114. In the asymmetrical arrangement, the purge port 110 and the pump port 112 are not symmetrically arranged about the center 114. For example, both the purge port 110 and the pump port 112 can be arranged within the same semi-circular region disposed below a midline 118, shown as a broken line in FIG. 1. As a result of the asymmetrical arrangement of the purge port 110 and the pump port 112, the purge gas introduced into the buffer chamber 104 through the purge port 110 exhibits a flow preference toward the pump port 112 relative to a second location within the buffer chamber 104, such as the other semicircular region above the midline 118, for example. Thus, depending on the location of the purge port 110 and the pump port 112 relative to one another, the distribution of the purge gas within the buffer chamber can be controlled, such as to a region below the midline 118, for example.

Figure 2:
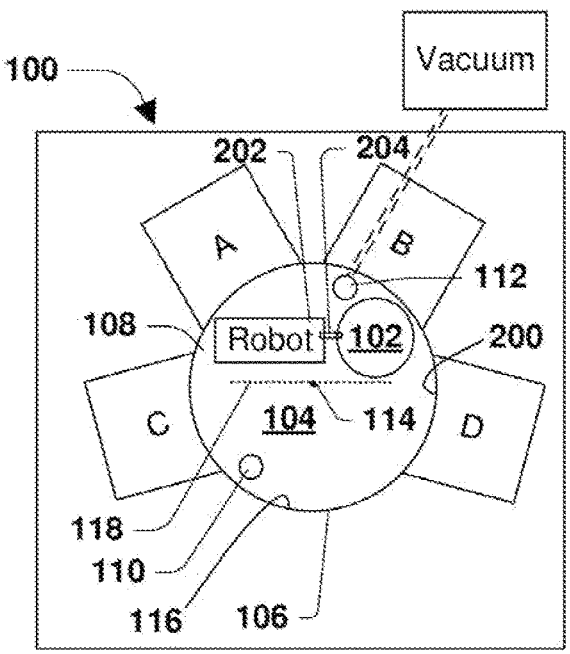
FIG. 2 illustrates an apparatus for fabricating a semiconductor device, comprising a symmetrical arrangement of a pump port and a purge port in accordance with some embodiments.

FIG. 2 illustrates the apparatus 100 for manufacturing a semiconductor device, comprising a symmetrical arrangement of the purge port 110 and the pump port 112, in accordance with some embodiments. In contrast to the asymmetrical arrangement in FIG. 1, the purge port 110 and the pump port 112 are arranged in different semi-circular regions separated by the midline 118. According to some embodiments, the pump port 112 is in fluid communication with a vacuum source. A portion of the purge gas introduced into the housing through the purge port 110 is exhausted from the housing through the pump port 112. At least one of the purge port 110 or the pump port 112, according to some embodiments, is formed in the floor 108 of the housing 106 defining the buffer chamber 104. In some embodiments, the pump port 112 is arranged approximately one hundred eighty degrees (180°), ±thirty five degrees (35°), or ±twenty five degrees (25°), or ±fifteen degrees (15°), about the center 114 of the floor 108 from the purge port 110. The symmetrical arrangement of the purge port 110 and the pump port 112 promotes uniform permeation of the purge gas throughout the buffer chamber 104 to a greater extent than the asymmetrical arrangement of the purge port 110 and the pump port 112. For example, an amount of the purge gas in the buffer chamber below the midline 118 is equal to or substantially equal to an amount of the purge gas in the buffer chamber above the midline 118.

Some embodiments of the apparatus 100 comprise a plurality of reactor ports 200 formed in the housing 106 for establishing interfaces with a plurality of process chambers, such as A, B, C, D, etc., for example. One or more of the process chambers A, B, C, D, etc. receive the wafer 102 during a fabrication process to perform one or more operations on the wafer, such as to deposit, etch, and/or otherwise fabricate the semiconductor device in, on, from, etc. the wafer 102. According to some embodiments, a wafer positioning robot 202 is positioned, at least partially, within the buffer chamber 104 to transport the wafer 102 between the plurality of process chambers A, B, C, D, etc. via the plurality of reactor ports 200. For example, the wafer positioning robot 202 can comprise a receiver 204 that supports the wafer 102 undergoing fabrication operations during which materials, such as silicon-based and/or germanium-based semiconducting materials, for example, are deposited onto the wafer 102. For fabrication processes that involve the deposition of a plurality of different materials, or deposition of materials under different conditions, the wafer positioning robot 202 can transport the wafer 102 between two or more of the different process chambers A, B, C, D, etc. and number of times.

Figure 3:
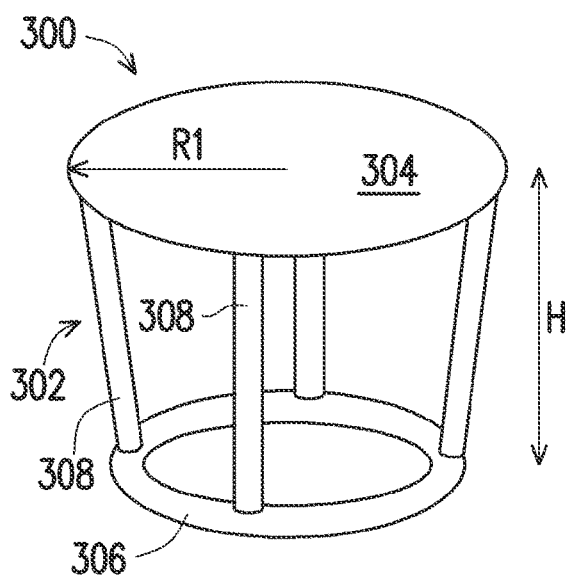
FIG. 3 illustrates a perspective view of a flow enhancer of an apparatus for fabricating a semiconductor device that, when arranged adjacent to a port formed in a housing defining a buffer chamber, alters a flow of a gas in accordance with some embodiments.

FIG. 3 is a perspective view of a first flow enhancer 300 that, when arranged adjacent to the purge port 110 or the pump port 112, alters a flow of the purge gas in accordance with some embodiments. Some embodiments of the first flow enhancer 300 comprise a frame 302 that supports a first cap 304. For example, embodiments of the frame 302 comprise a base 306 from which one or more uprights 308 extend. Some embodiments of the base 306 are formed from a metallic rod bent into an arcuate shape such as a circle, for example.

The dimensions of the base 306 are suitable to allow the base 306 to be at least partially inserted into at least one of the purge port 110 or the pump port 112, according to some embodiments. Configuring the base 306 to be at least partially inserted into the purge port 110 or the pump port 112 allows the first flow enhancer 300 to be inserted and installed in the purge port 110 or the pump port 112 as an aftermarket addition to an existing buffer chamber. Installed in the purge port 110 or the pump port 112, the frame 302 supports the first cap 304 at a first elevation vertically above the purge port 110 and/or the pump port 112 as described below.

According to some embodiments, the first cap 304 is formed as a planar sheet of material having a circular, ovular, rectangular, etc. shape suitable to direct the flow of purge gas into the directions described herein. For the embodiment shown in FIG. 3, the first cap 304 comprises a circular shape coupled to a top portion of the frame 302, separated from the base 306 by the uprights 308. According to some embodiments, the first cap 304 comprises a circular footprint, and a ratio of a radius R1 of the circular footprint of the first cap 304, to a height H1 of the frame 302 falls within a range from about 1.0, up to about 4.0.

Figure 4:
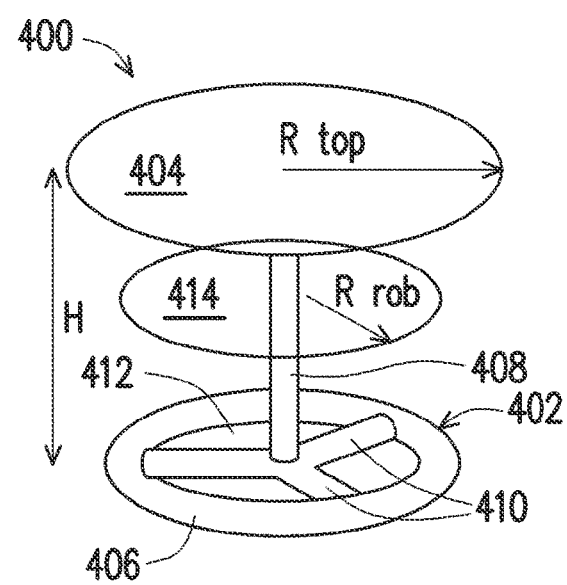
FIG. 4 illustrates a perspective view of a flow enhancer of an apparatus for fabricating a semiconductor device that, when arranged adjacent to a port formed in a housing defining a buffer chamber, alters a flow of a gas in accordance with some embodiments.

FIG. 4 is a perspective view of a second flow enhancer 400 that, when arranged adjacent to the purge port 110 or the pump port 112, alters a flow of the purge gas as described herein. According to some embodiments, the second flow enhancer 400 comprises a frame 402 supporting a second cap 404. The second cap 404 can be formed as a planar sheet of material having a circular, ovular, rectangular, etc. shape suitable to direct the flow of purge gas into the directions described herein. According to some embodiments, the frame 402 comprises a base 406 from which an upright 408, and optionally a single central upright extends. Some embodiments of the base 406 are formed from a metallic rod bent into an arcuate shape such as a circle, for example. At least one, and optionally a plurality of spokes 410 extend between the base 406 and the upright 408.

The dimensions of the base 406 are suitable to allow the base 406 to be at least partially inserted into at least one of the purge port 110 or the pump port 112, according to some embodiments. Configuring the base 406 to be at least partially inserted into the purge port 110 or the pump port 112 allows the second flow enhancer 400 to be inserted and installed in the purge port 110 or the pump port 112 as an aftermarket addition to an existing buffer chamber. Installed in the purge port 110 or the pump port 112, the frame 402 supports the second cap 404 at a second elevation vertically above the purge port 110 or the pump port 112 as described below.

According to some embodiments, the frame 402 supports a third cap 414. The third cap 414 can be formed as a planar sheet of material having a circular, ovular, rectangular, etc. shape suitable to direct the flow of purge gas into the directions described herein. According to some embodiments, the frame 402 supports the third cap 414 at a third elevation vertically between the purge port 110 or the pump port 112 in which the second flow enhancer 400 is installed and the second cap 404. For the embodiments shown in FIG. 4, the second cap 404 and the third cap 414 comprise circular shapes, and are coupled to different portions the frame 402, separated from the base 406 by portions of the upright 408.

According to some embodiments, the third cap 414 comprises a circular footprint, and a ratio of a radius $R_{bot}$ of the circular footprint of the third cap 414 to a height H of the frame 402 is within a range from about 0.25, up to about 1.5. When the second flow enhancer 400 is arranged adjacent to the purge port 110 or the pump port 112, the frame 402 supports the third cap 414 at a second elevation vertically between the purge port 110 or the pump port 112 and the second cap 404. According to some embodiments, the second cap 404 and the third cap 414 comprise circular footprints, and a ratio of a radius $R_{top}$ of the circular footprint of the second cap 404 to a radius $R_{bot}$ of the circular footprint of the third cap is within a range from about 1.5, up to about 5.

Figure 5:
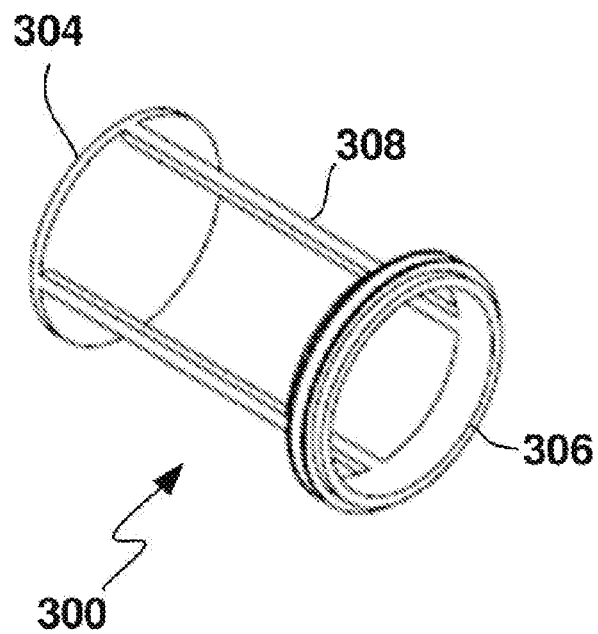
FIG. 5 illustrates a perspective view of a flow enhancer of an apparatus for fabricating a semiconductor device that, when arranged adjacent to a port formed in a housing defining a buffer chamber, alters a flow of a gas in accordance with some embodiments.
Figure 6:
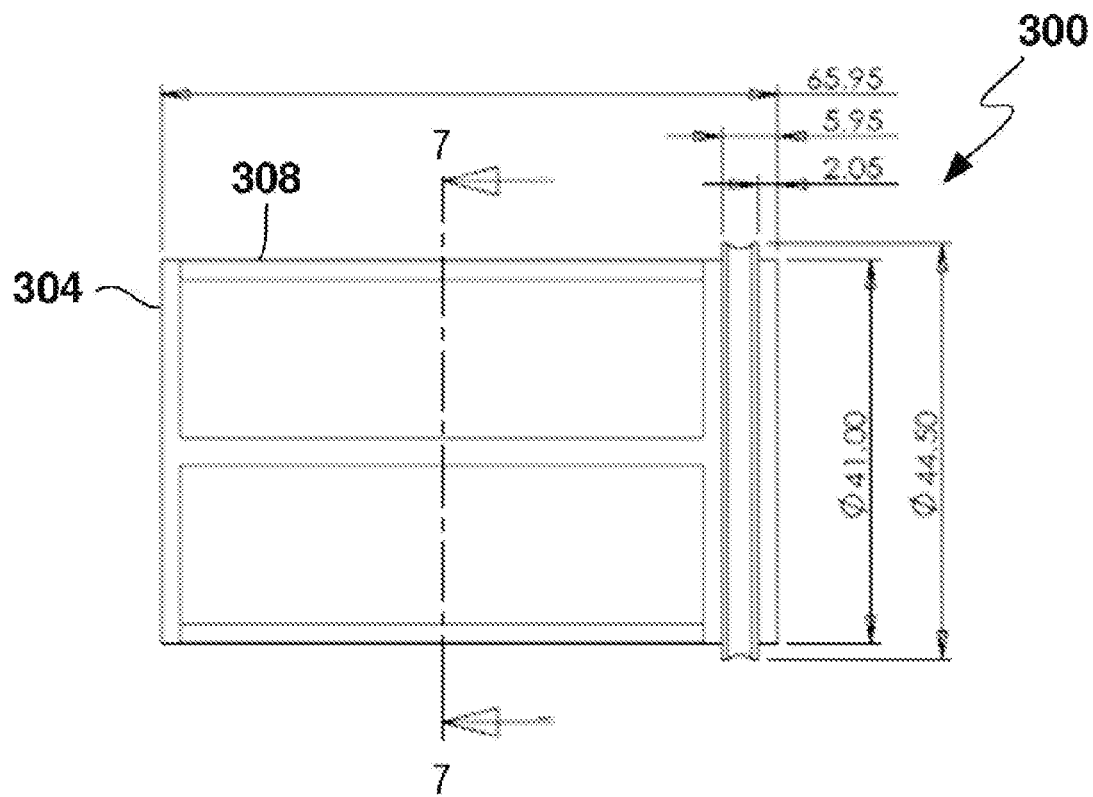
FIG. 6 illustrates a side view of a flow enhancer of an apparatus for fabricating a semiconductor device that, when arranged adjacent to a port formed in a housing defining a buffer chamber, alters a flow of a gas in accordance with some embodiments.
Figure 7:
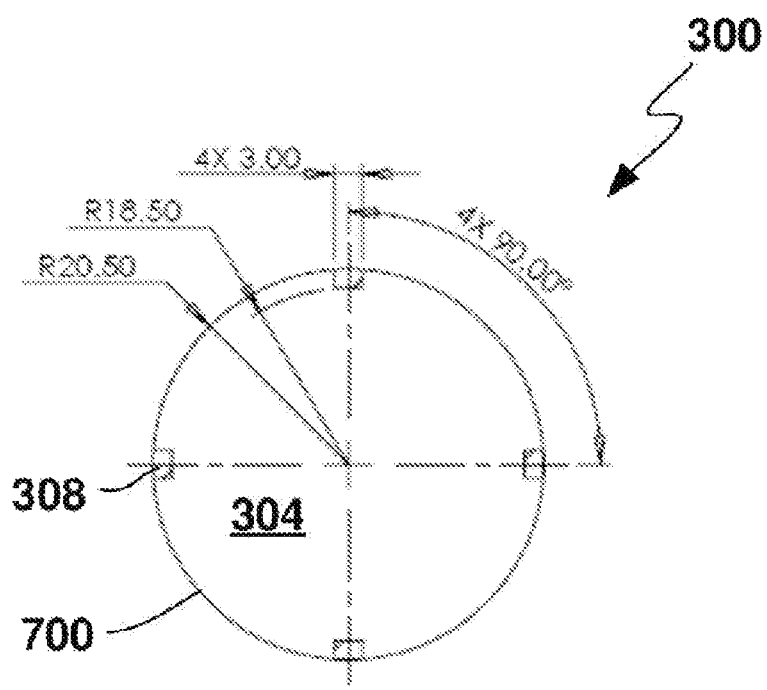
FIG. 7 illustrates a cross-sectional view of the flow enhancer taken along line 7-7 in FIG. 6, in accordance with some embodiments.
Figure 8:
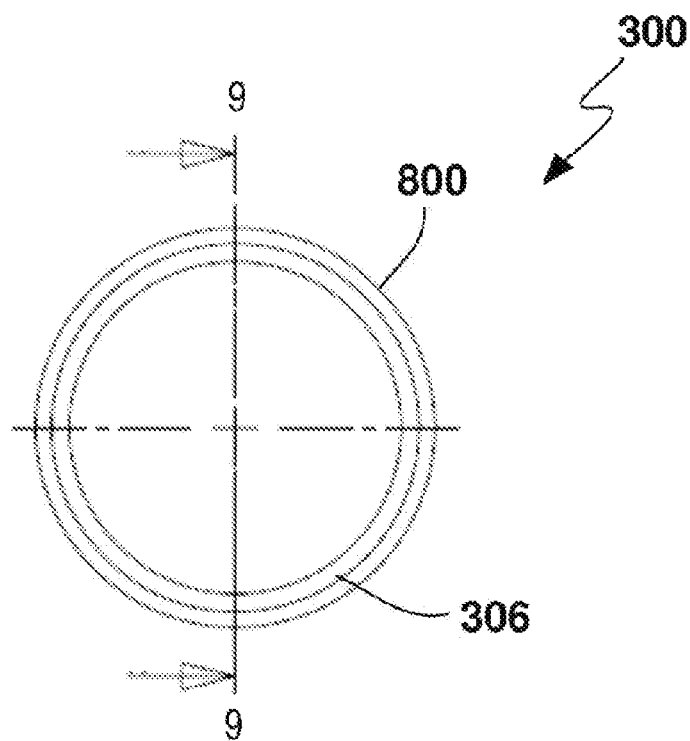
FIG. 8 illustrates a bottom view of a flow enhancer of an apparatus for fabricating a semiconductor device that, when arranged adjacent to a port formed in a housing of a buffer chamber, alters a flow of a gas in accordance with some embodiments.
Figure 9:
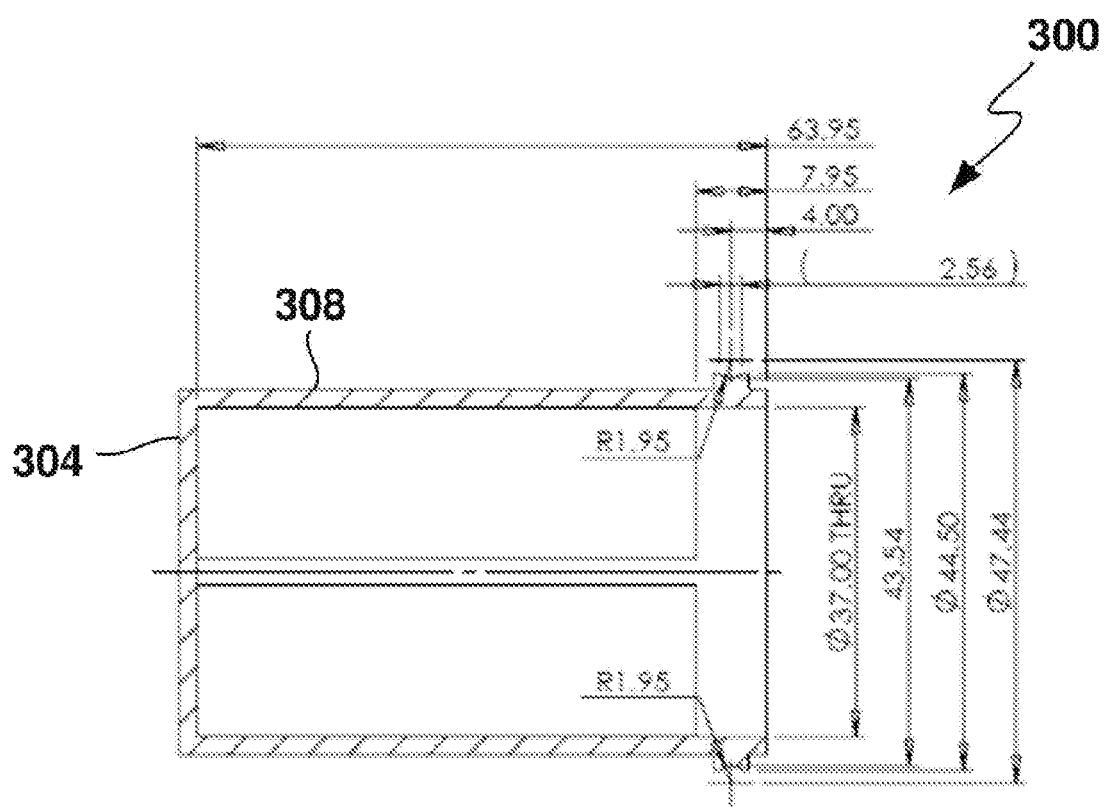
FIG. 9 illustrates a cross-sectional view of the flow enhancer taken along line 9-9 in FIG. 8 in accordance with some embodiments.

FIGS. 5-9 are views of a schematic representation of the first flow enhancer 300, according to some embodiments. FIG. 5 is a perspective view of the first flow enhancer 300, and FIG. 6 is a side view of the first flow enhancer 300. The uprights 308 of the embodiments shown in FIGS. 5-9 are vertical, extending upward in a direction to form a right angle relative to the first cap 304, as opposed to the uprights 308 shown in FIG. 3, which form an angle of less than ninety degrees (90°) with respect to the first cap 304. As shown in FIG. 7, the uprights 308 can be arranged flush with an exterior periphery 700 of the first cap 304. As shown in FIGS. 8 and 9, the uprights 308 can be inset from the exterior periphery 800 of the base 306, so as not to be visible when the first flow enhancer 300 is viewed from below, as shown in FIG. 8. It is to be appreciated that the dimensions illustrated in FIGS. 5-9 are merely examples, and the instant application, including the scope of the claims, is not limited to the same.

Figure 10:
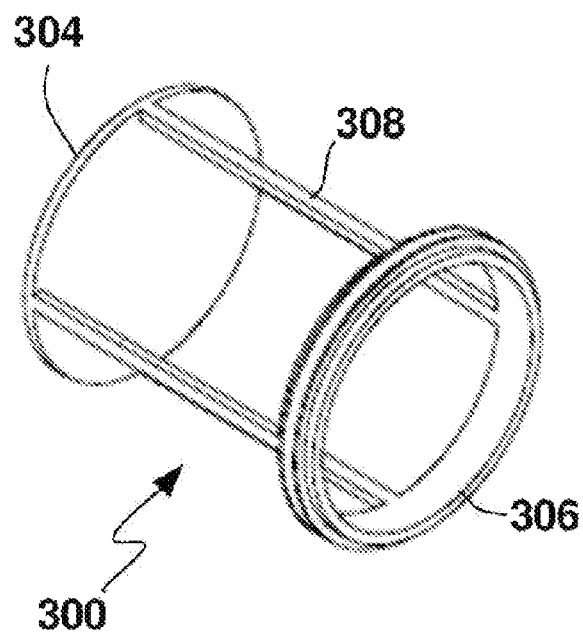
FIG. 10 illustrates a perspective view of a flow enhancer of an apparatus for fabricating a semiconductor device that, when arranged adjacent to a port formed in a housing defining a buffer chamber, alters a flow of a gas in accordance with some embodiments.
Figure 11:
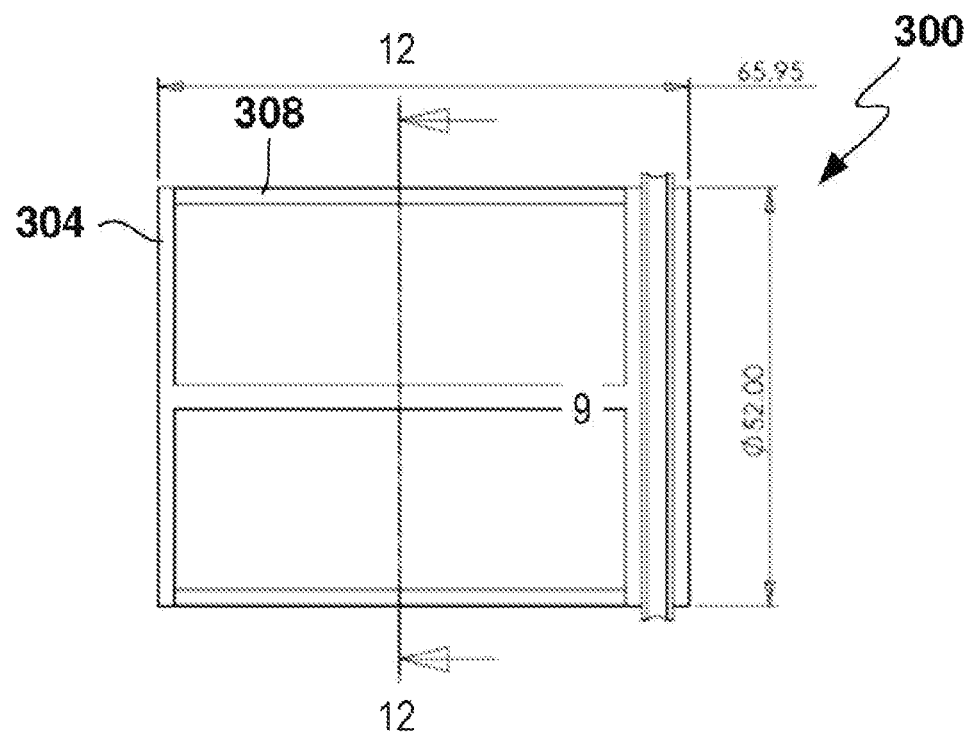
FIG. 11 illustrates a side view of a flow enhancer of an apparatus for fabricating a semiconductor device that, when arranged adjacent to a port formed in a housing defining a buffer chamber, alters a flow of a gas in accordance with some embodiments.
Figure 12:
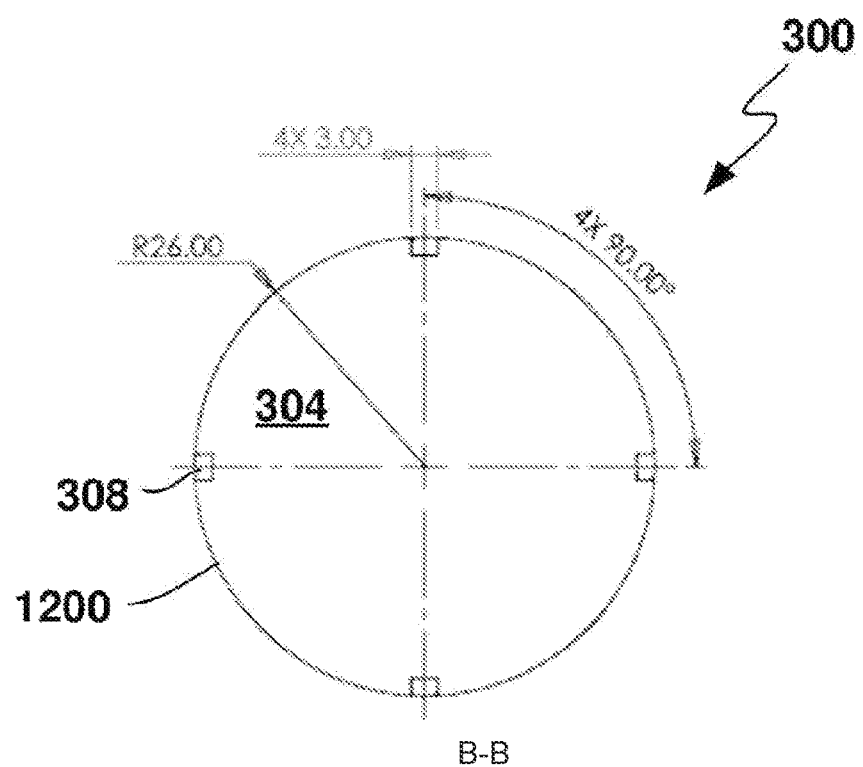
FIG. 12 illustrates a cross-sectional view of the flow enhancer taken along line 12-12 in FIG. 11 in accordance with some embodiments.
Figure 13:
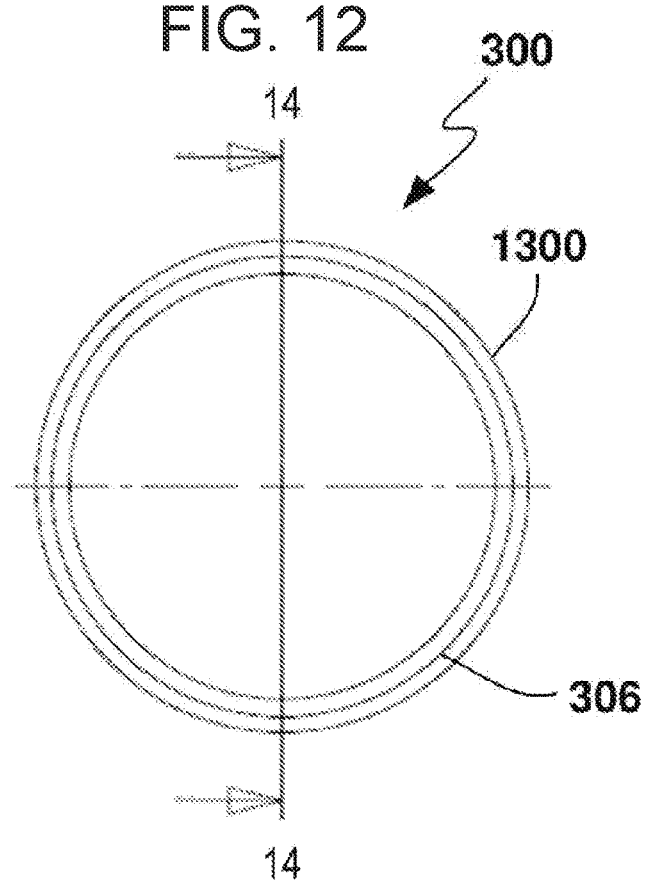
FIG. 13 illustrates a bottom view of a flow enhancer of an apparatus for fabricating a semiconductor device that, when arranged adjacent to a port formed in a housing defining a buffer chamber, alters a flow of a gas in accordance with some embodiments.
Figure 14:
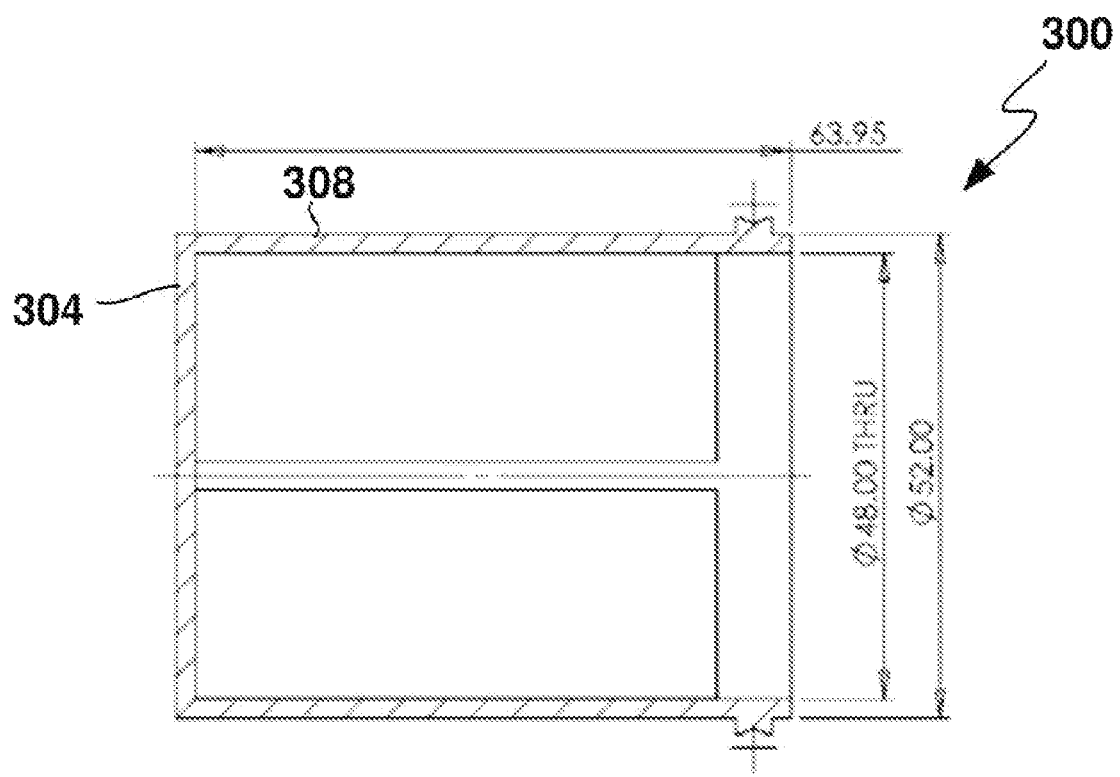
FIG. 14 illustrates a cross-sectional view of the flow enhancer taken along line 14-14 in FIG. 13 in accordance with some embodiments.

FIGS. 10-14 are views of another schematic representation of the first flow enhancer 300, according to some embodiments. What is shown in FIGS. 10-14 is similar to what is shown in FIGS. 5-9 but has, for example, at least some different dimensions. FIG. 10 is a perspective view of the first flow enhancer 300, and FIG. 11 is a side view of the first flow enhancer 300. The uprights 308 of the embodiments shown in FIGS. 10-14 are vertical, extending upward in a direction to form a right angle relative to the first cap 304, as opposed to the uprights 308 shown in FIG. 3, which form an angle of less than ninety degrees (90°) with respect to the first cap 304. As shown in FIG. 12, the uprights 308 can be arranged flush with an exterior periphery 1200 of the first cap 304. As shown in FIGS. 13 and 14, the uprights 308 can be inset from the exterior periphery 1300 of the base 306, so as not to be visible when the first flow enhancer 300 is viewed from below, as shown in FIG. 13. It is to be appreciated that the dimensions illustrated in FIGS. 10-14 are merely examples, and the instant application, including the scope of the claims, is not limited to the same.

Figure 15:
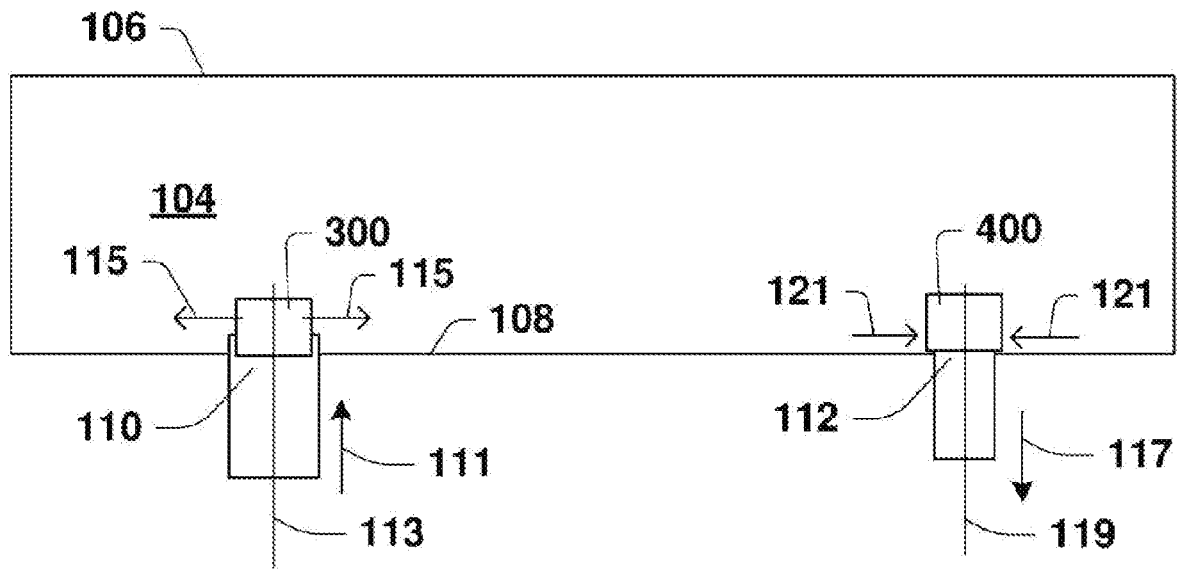
FIG. 15 illustrates a partially cutaway view of a buffer chamber defined by a housing of an apparatus for fabricating a semiconductor device comprising a flow enhancer arranged adjacent to a purge port in accordance with some embodiments.

FIG. 15 is a partially cutaway view of the housing 106 within which is defined the buffer chamber 104. The purge port 110 and the pump port 112 are formed in the floor 108 of the housing 106. The first flow enhancer 300 is arranged adjacent to the purge port 110, in accordance with some embodiments. Although not shown, the second flow enhancer 400 can instead be arranged adjacent to the purge port 110, according to some embodiments.

The purge gas is imparted to the buffer chamber 104 through the purge port 110 in the first axial direction 111 along the longitudinal axis 113 of the purge port 110. As the purge gas encounters the first flow enhancer 300, the purge gas is forced to travel around the first flow enhancer 300 and is thereby directed in the plurality of radial directions 115 relative to the longitudinal axis 113.

According to some embodiments, a pressure at the pump port 112 is less than a pressure within the buffer chamber 104 such that a partial vacuum is established at the pump port 112 to draw a portion of the purge gas from the buffer chamber 104 through the pump port 112 in the second axial direction 117 along the longitudinal axis 119 of the pump port 112.

According to some embodiments, the second flow enhancer 400 is arranged adjacent to the pump port 112 to direct the portion of the purge gas being drawn from the buffer chamber in a radial flow direction 121 toward the longitudinal axis 119 of the pump port 112. The portion of the purge gas being directed in the radial flow direction 121 is ultimately redirected, such as due to the pressure differential between the pump port 112 and the buffer chamber 104, to flow through the pump port 112 in the second axial direction 117 along the longitudinal axis 119 of the pump port 112.

Although not shown, the first flow enhancer 300 can instead be arranged adjacent to the pump port 112, according to some embodiments. Also, although not shown, a first instance of the first flow enhancer 300 can be arranged adjacent to the purge port 110 while a second instance of the first flow enhancer 300 can be arranged adjacent to the pump port 112. Further, although not shown, a first instance of the second flow enhancer 400 can be arranged adjacent to the purge port 110 while a second instance of the second flow enhancer 400 can be arranged adjacent to the pump port 112. In some embodiments, a flow enhancer arranged adjacent to a port can include the flow enhancer at least partially inserted into, concentric with, slightly offset from, etc. the port.

Figure 16:
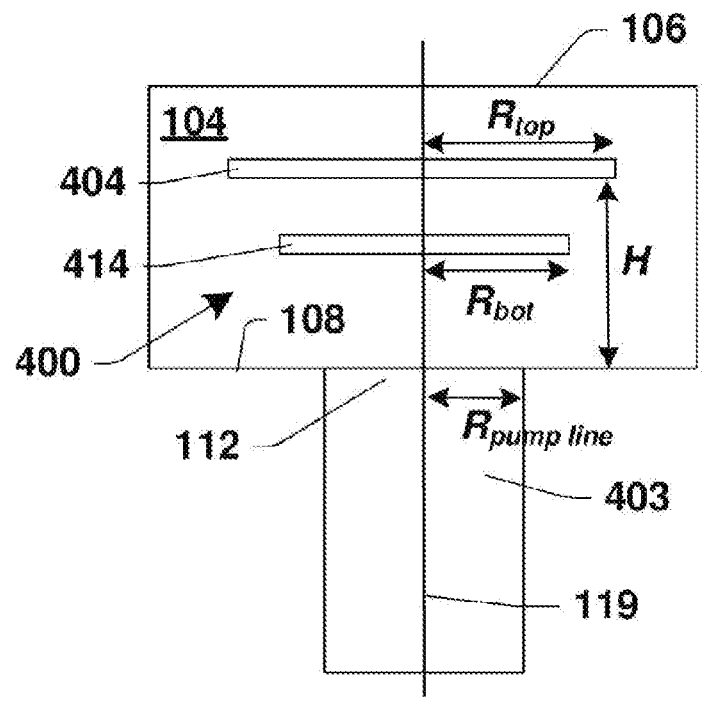
FIG. 16 illustrates a partially cutaway view of a port formed in a housing defining a buffer chamber of an apparatus for fabricating a semiconductor device and a flow enhancer comprising a plurality of caps arranged adjacent to the port in accordance with some embodiments.

FIG. 16 illustrates a partially cutaway view of the housing 106 within which is defined the buffer chamber 104. A flow enhancer, such as the second flow enhancer 400, is arranged adjacent to the pump port 112. A pump line 403, through which the purge gas is evacuated from the buffer chamber 104 along the longitudinal axis 119, is associated with the pump port 112. The second flow enhancer 400 has a plurality of caps, such as the second cap 404 and the third cap 414.

According to some embodiments, the apparatus satisfies the ratios:

$$\text{about } 1.5 \leq \frac{R_{top}}{H} \leq \text{about } 3.0$$

$$\text{about } 0.5 \leq \frac{R_{bot}}{H} \leq \text{about } 1.0$$

$$\text{about } 1.0 \leq \frac{R_{top}, R_{bot}}{R_{pump\,line}} \leq \text{about } 4.0$$

$$\text{about } 2.0 \leq \frac{R_{top}}{R_{bot}} \leq \text{about } 4.0$$

Where $R_{top}$ is the radius of the second cap 404, $R_{bot}$ is the radius of the third cap 414, $R_{pump\,line}$ is the radius of the pump line 403, and H is the height or distance of the second cap 404 from the floor 108 of the housing 106. According to some embodiments, at least some of the foregoing, ratio(s), range(s), etc. are critical, at least, to promote a desired purge gas distribution relative to the buffer chamber, such as flow volume, flow rate, density, etc. of purge gas into, within, out of, etc. the buffer chamber, which in turn promotes desired fabrication of the semiconductor device, such as with regard to size, shape, operating parameters, such as voltage(s), uniformity relative to other semiconductor devices formed in, on, from, etc. the semiconductor wafer, etc.

Figure 17:
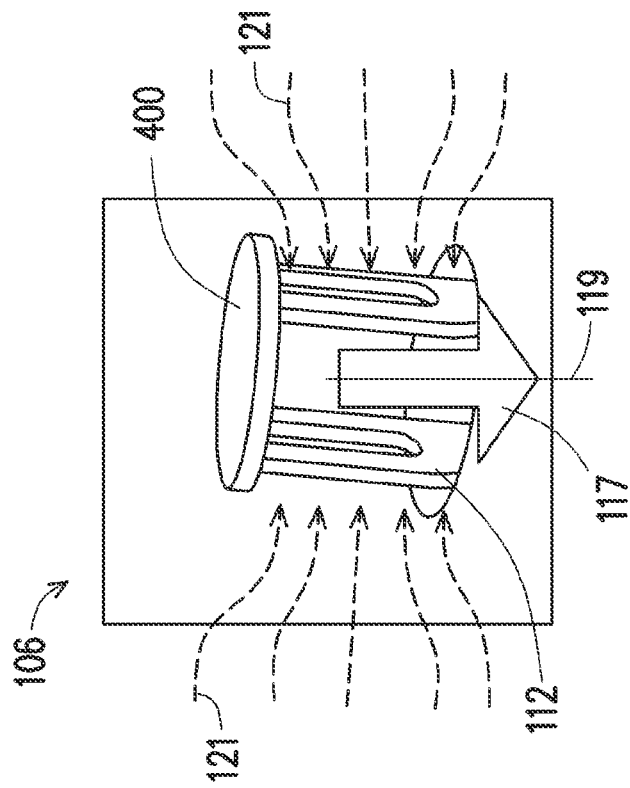
FIG. 17 illustrates a perspective view of a flow enhancer arranged adjacent to a purge port of a buffer chamber defined by a housing of an apparatus for fabricating a semiconductor device, wherein pattern lines represent flow patterns of a purge gas being introduced into the buffer chamber through the purge port in accordance with some embodiments.

FIG. 17 is imagery of a perspective view of the housing 106 within which is defined the buffer chamber 104. The first flow enhancer 300 is arranged adjacent to the purge port 110, in accordance with some embodiments. The purge gas is imparted to the buffer chamber 104 through the purge port 110 in the first axial direction 111 along the longitudinal axis 113 of the purge port 110. As the purge gas encounters the first flow enhancer 300, the purge gas is redirected in the plurality of radial directions 115 relative to the longitudinal axis 113.

Figure 18:
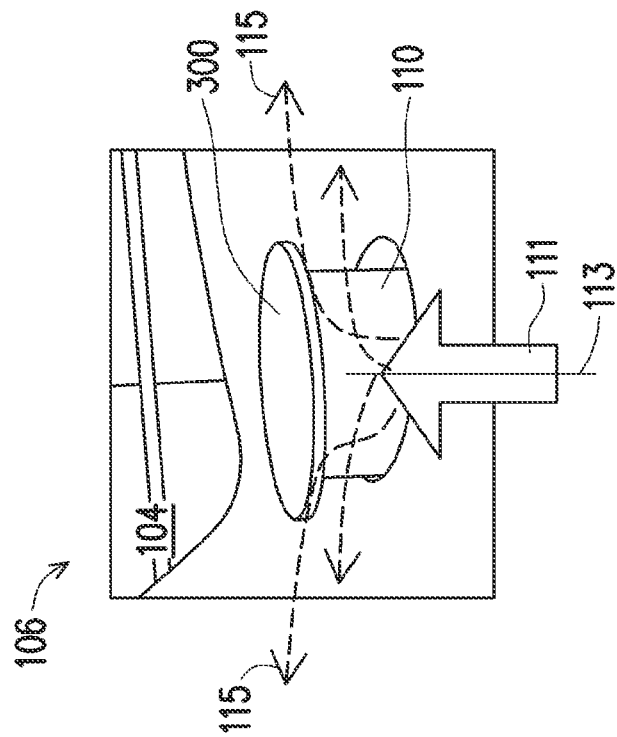
FIG. 18 illustrates a perspective view of a flow enhancer arranged adjacent to a pump port of a buffer chamber defined by a housing of an apparatus for fabricating a semiconductor device, wherein pattern lines represent flow patterns of a purge gas being drawn from the buffer chamber through the pump port in accordance with some embodiments.

FIG. 18 is imagery of a perspective view of the housing 106 within which is defined the buffer chamber 104. The second flow enhancer 400 is arranged adjacent to the pump port 112, in accordance with some embodiments. The partial vacuum at the pump port 112 draws a portion of the purge gas from the buffer chamber 104 toward the pump port 112. The second flow enhancer 400 directs the portion of the purge gas being drawn from the buffer chamber in the radial flow direction 121. The portion of the purge gas being directed in the radial flow direction 121 is ultimately redirected to flow through the pump port 112 in the second axial direction 117 along the longitudinal axis 119 of the pump port 112.

Figure 20:
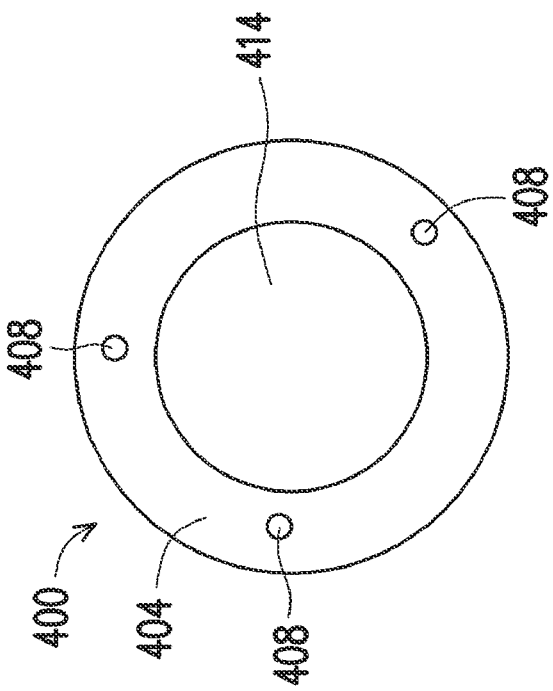
FIG. 20 illustrates a bottom view of a portion of a flow enhancer of an apparatus for fabricating a semiconductor device depicting a size of a first cap relative to a size of a second cap in accordance with some embodiments.
Figure 19:
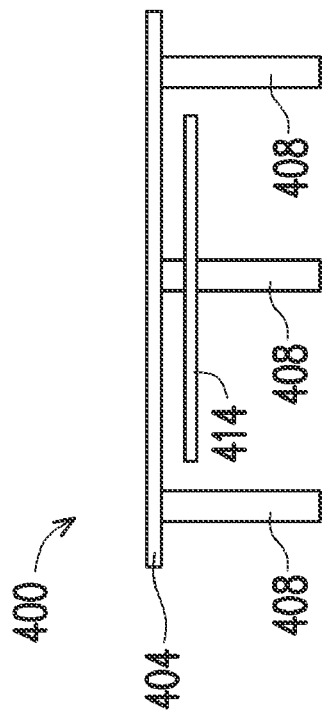
FIG. 19 illustrates a side view of a top portion of a flow enhancer of an apparatus for fabricating a semiconductor device comprising a frame supporting a first cap and a second cap in accordance with some embodiments.

FIG. 19 illustrates a side view of a top portion of a flow enhancer, such as the second flow enhancer 400, according to some embodiments. FIG. 20 illustrates a bottom view of a portion of a flow enhancer, such as the second flow enhancer 400, according to some embodiments. FIGS. 19 and 20 illustrate that the second cap 404 is larger than the third cap 414, such as having a larger diameter, circumference, radius, etc., and that a plurality of uprights 408 are implemented to support the second cap 404 and the third cap 414 and/or to separate the second cap 404 and the third cap 414.

Figure 21:
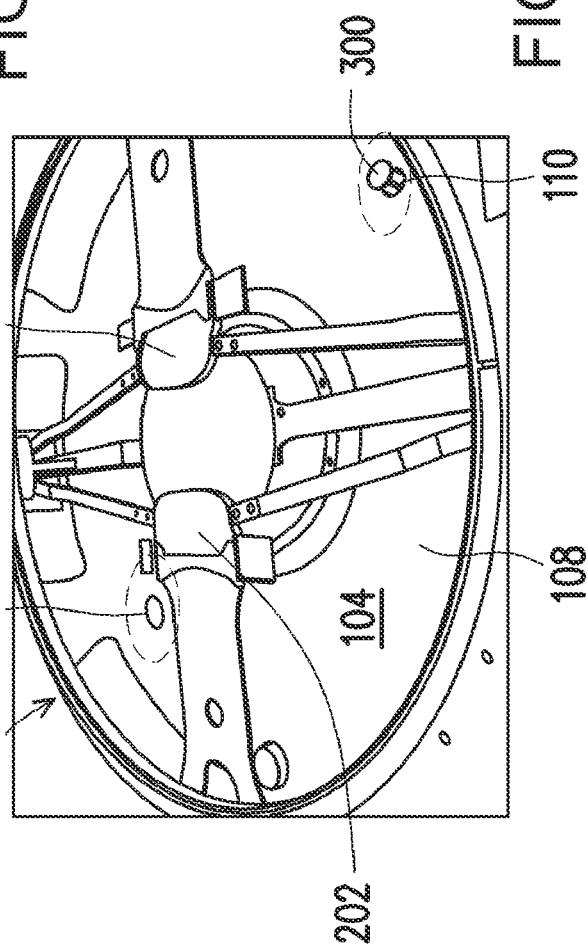
FIG. 21 illustrates a perspective view of a buffer chamber defined by a housing of an apparatus for fabricating a semiconductor device, where a purge port and a pump port are defined by the housing and a wafer positioning robot is disposed in the buffer chamber in accordance with some embodiments.

FIG. 21 is imagery of a perspective view of the housing 106 within which is defined the buffer chamber 104. The purge port 110 and the pump port 112 are formed in the floor 108 of the housing 106. A flow enhancer, such as the first flow enhancer 300, is arranged adjacent to the purge port 110, in accordance with some embodiments. The wafer positioning robot 202 is disposed within the buffer chamber 104 to maneuver the wafer within the apparatus.

Figure 22:
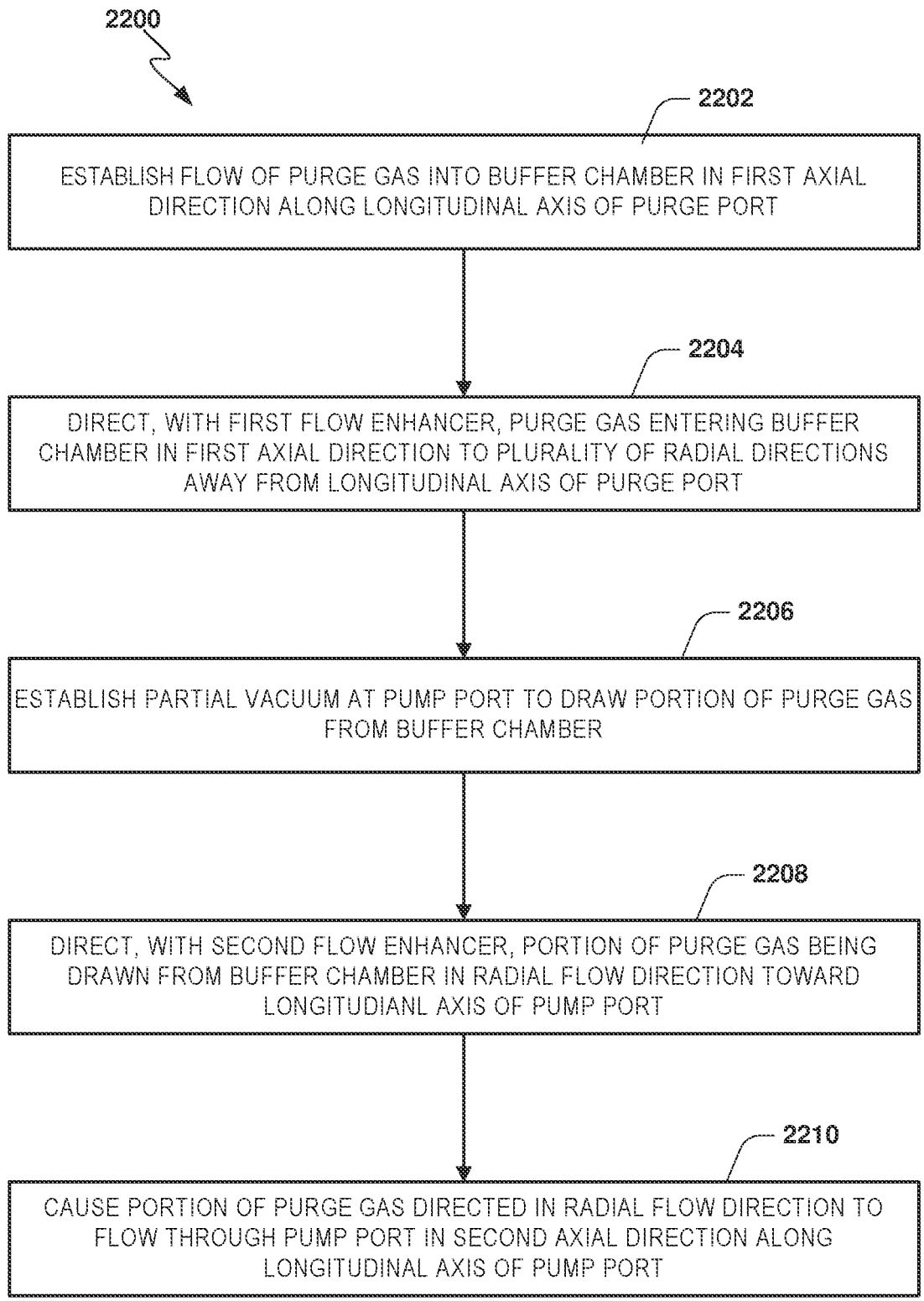
FIG. 22 illustrates a flow diagram of a method for distributing a purge gas within a buffer chamber in accordance with some embodiments.

FIG. 22 illustrates a flow diagram of a method 2200 for promoting uniform distribution of a purge gas in the buffer chamber 104, according to some embodiments. At 2202, a flow of the purge gas into the buffer chamber 104 is established in the first axial direction 111 along the longitudinal axis 113 of the purge port 110 formed in the floor 108 of the housing 106 defining the buffer chamber 104. At 2204, the first flow enhancer 300 is used to direct the purge gas entering the buffer chamber 104 in the first axial direction 111 to the plurality of radial directions 115 extending generally away from the longitudinal axis 113 of the purge port 110. According to some embodiments, at least some of the radial directions 115 are at least one of not coplanar to the floor 108, not coplanar to one another, not perpendicular to the longitudinal axis 113, etc. At 2206, the partial vacuum is established at the pump port 112 formed in the floor 108 defining the buffer chamber 104 to draw the portion of the purge gas from the buffer chamber 104. According to some embodiments, the partial vacuum corresponds to a pressure differential between the buffer chamber 104 and the pump port 112, where the pressure in the buffer chamber 104 is greater than the pressure in the pump port 112 so that the purge gas is urged from the buffer chamber 104 to the pump port 112. At 2208, the second flow enhancer 400 is used to direct the portion of the purge gas being drawn from the buffer chamber 104 in the radial flow direction 121 toward the longitudinal axis 119 of the pump port 112. At 2210, the portion of the purge gas directed in the radial flow direction 121 is caused to flow through the pump port in the second axial direction 117 along the longitudinal axis 119 of the pump port 112.

According to some embodiments, at least some of at least one of dimension(s), shape(s), location(s), ratio(s), etc. of at least one of the first flow enhancer or the second flow enhancer described herein are critical, at least, to promote a desired purge gas distribution relative to the buffer chamber, such as flow volume, flow rate, density, etc. of purge gas into, within, out of, etc. the buffer chamber, which in turn promotes desired fabrication of the semiconductor device, such as with regard to size, shape, operating parameters, such as voltage(s), uniformity relative to other semiconductor devices formed in, on, from, etc. the semiconductor wafer, etc. For example, the rate, volume, degree, etc. to which the purge gas is forced to at least one of move in the radial directions 115 from the first axial direction 111 or move in the second axial direction 117 from the radial flow direction 121 is a function of at least some of at least one of the dimension(s), shape(s), location(s), ratio(s), etc. of at least one of the first flow enhancer 300 or the second flow enhancer 400, which in turn promotes the desired purge gas distribution relative to the buffer chamber.

According to some embodiments, an apparatus for fabricating a semiconductor device is provided. The apparatus has a housing defining a buffer chamber and a plurality of reactor ports formed in the housing for establishing interfaces with a plurality of process chambers that are to receive a wafer during a fabrication process to fabricate the semiconductor device. The apparatus has a wafer positioning robot positioned, at least partially, within the buffer chamber to transport the wafer between the plurality of process chambers through the plurality of reactor ports. The apparatus has a purge port formed in the housing for introducing a purge gas into the buffer chamber and a pump port formed in the housing for exhausting a portion of the purge gas from the buffer chamber. The apparatus has a first flow enhancer that, when arranged adjacent to the purge port, directs the purge gas flowing in an axial direction along a longitudinal axis of the purge port into the buffer chamber in a plurality of radial directions relative to the longitudinal axis.

According to some embodiments, an apparatus for fabricating a semiconductor device is provided. The apparatus has a housing defining a buffer chamber and a plurality of reactor ports formed in the housing for establishing interfaces with a plurality of process chambers that are to receive a wafer during a fabrication process to fabricate the semiconductor device. The apparatus has a wafer positioning robot positioned, at least partially, within the buffer chamber to transport the wafer between the plurality of process chambers through the plurality of reactor ports. The apparatus has a purge port formed in a floor of the housing for introducing a purge gas into the buffer chamber and a pump port formed in the floor of the housing for exhausting a portion of the purge gas from the buffer chamber, wherein the pump port is arranged approximately one hundred eighty degrees (180°) about a center point of the floor from the purge port. The apparatus has a first flow enhancer comprising a first frame that supports a first cap to direct an axial flow of the purge gas entering the buffer chamber along a longitudinal axis of the purge port to a plurality of radial directions. The apparatus has a second flow enhancer comprising a second frame that supports a second cap to direct a portion of the purge gas drawn into the pump port from the buffer chamber in a radial direction relative to a longitudinal axis of the pump port, before the portion of the purge gas drawn into the pump port travels in an axial direction along the longitudinal axis of the pump port.

According to some embodiments, a method of promoting uniform distribution of a purge gas in a buffer chamber is provided. The method includes establishing a flow of the purge gas into the buffer chamber in a first axial direction along a longitudinal axis of a purge port formed in a floor defining the buffer chamber and directing, with a first flow enhancer, the purge gas entering the buffer chamber in the first axial direction to a plurality of radial directions extending generally away from the longitudinal axis of the purge port. The method includes establishing a partial vacuum at a pump port formed in the floor defining the buffer chamber to draw a portion of the purge gas from the buffer chamber and directing, with a second flow enhancer, the portion of the purge gas being drawn from the buffer chamber in a radial flow direction toward a longitudinal axis of the pump port. The method includes causing the portion of the purge gas directed in the radial flow direction to flow through the pump port in a second axial direction along the longitudinal axis of the pump port.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that components, sensors, actuators, substrates, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" or "illustrative," to the extent used herein, mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components the terms used to describe such components are intended to correspond, unless otherwise indicated, to any component which performs the specified function of the described component (for example, a term that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An apparatus for fabricating a semiconductor device, the apparatus comprising:
    a housing defining a buffer chamber;
    a plurality of reactor ports formed in the housing for establishing interfaces with a plurality of process chambers that are to receive a wafer during a fabrication process to fabricate the semiconductor device;
    a wafer positioning robot positioned, at least partially, within the buffer chamber to transport the wafer between the plurality of process chambers through the plurality of reactor ports;
    a purge port formed in the housing for introducing a purge gas into the buffer chamber;
    a pump port formed in the housing for exhausting a portion of the purge gas from the buffer chamber; and
    a first flow enhancer that, when arranged adjacent to the purge port, directs the purge gas flowing in an axial direction along a longitudinal axis of the purge port into the buffer chamber in a plurality of radial directions relative to the longitudinal axis, wherein:
        the first flow enhancer comprises a frame that supports a first cap at a first elevation vertically above the purge port, and
        the frame supports a second cap at a second elevation vertically between the purge port and the first cap.

2. The apparatus of claim 1, wherein:
    the second cap comprises a circular footprint, and
    a ratio of a radius of the circular footprint of the second cap to a height of the frame is at least 0.25, and up to 1.5.

3. The apparatus of claim 1, wherein:
    the purge port comprises an arcuate wall defining a circular aperture,
    the second cap comprises a circular footprint, and
    a ratio of a radius of the circular footprint of the second cap, to a radius of the circular aperture of the purge port is at least 0.5, and up to 5.

4. The apparatus of claim 1, wherein:
    the first cap comprises a circular footprint,
    the second cap comprises a circular footprint, and
    a ratio of a radius of the circular footprint of the first cap to a radius of the circular footprint of the second cap is at least 1.5, and up to 5.

5. The apparatus of claim 1, wherein:
    the first cap comprises a circular footprint, and
    a ratio of a radius of the circular footprint of the first cap to a height of the frame is at least 1.0, and up to 4.0.

6. The apparatus of claim 1, wherein:
    the purge port comprises an arcuate wall defining a circular aperture,
    the first cap comprises a circular footprint, and
    a ratio of a radius of the circular footprint of the first cap to a radius of the circular aperture of the purge port is at least 0.5, and up to 5.

7. The apparatus of claim 1, wherein:
    the housing comprises a floor, and
    the purge port is formed in the floor of the housing.

8. The apparatus of claim 7, wherein:
    the pump port is formed in the floor of the housing, and
    the pump port is arranged approximately one hundred eighty degrees (180°) about a center point of the floor from the purge port.

9. The apparatus of claim 1, wherein the first flow enhancer is concentrically arranged with the purge port.

10. The apparatus of claim 1, comprising a second flow enhancer that, when arranged adjacent to the pump port, directs a portion of the purge gas drawn into the pump port from the buffer chamber in a radial direction relative to a longitudinal axis of the pump port, before the portion of the purge gas drawn into the pump port travels in an axial direction along the longitudinal axis of the pump port.

11. An apparatus for fabricating a semiconductor device, the apparatus comprising:
    a housing defining a buffer chamber;
    a plurality of reactor ports formed in the housing for establishing interfaces with a plurality of process chambers that are to receive a wafer during a fabrication process to fabricate the semiconductor device;
    a wafer positioning robot positioned, at least partially, within the buffer chamber to transport the wafer between the plurality of process chambers through the plurality of reactor ports;
    a purge port formed in the housing for introducing a purge gas into the buffer chamber;
    a pump port formed in the housing for exhausting a portion of the purge gas from the buffer chamber;
    a first flow enhancer that, when arranged adjacent to the purge port, directs the purge gas flowing in an axial direction along a longitudinal axis of the purge port into the buffer chamber in a plurality of radial directions relative to the longitudinal axis; and
    a second flow enhancer that, when arranged adjacent to the pump port, directs a portion of the purge gas drawn into the pump port from the buffer chamber in a radial direction relative to a longitudinal axis of the pump port, before the portion of the purge gas drawn into the pump port travels in an axial direction along the longitudinal axis of the pump port.

12. The apparatus of claim 11, wherein the first flow enhancer comprises a frame that supports a first cap at a first elevation vertically above the purge port.

13. The apparatus of claim 12, wherein:
    the first cap comprises a circular footprint, and
    a ratio of a radius of the circular footprint of the first cap to a height of the frame is at least 1.0, and up to 4.0.

14. The apparatus of claim 12, wherein:
    the purge port comprises an arcuate wall defining a circular aperture,
    the first cap comprises a circular footprint, and
    a ratio of a radius of the circular footprint of the first cap to a radius of the circular aperture of the purge port is at least 0.5, and up to 5.

15. The apparatus of claim 12, wherein the frame supports a second cap at a second elevation vertically between the purge port and the first cap.

16. An apparatus for fabricating a semiconductor device, the apparatus comprising:
    a housing defining a buffer chamber;
    a plurality of reactor ports formed in the housing for establishing interfaces with a plurality of process chambers that are to receive a wafer during a fabrication process to fabricate the semiconductor device;
    a wafer positioning robot positioned, at least partially, within the buffer chamber to transport the wafer between the plurality of process chambers through the plurality of reactor ports;
    a purge port formed in the buffer chamber for introducing a purge gas into the buffer chamber;
    a pump port formed in the buffer chamber for exhausting a portion of the purge gas from the buffer chamber; and
    a first flow enhancer that, when arranged adjacent to the purge port, directs the purge gas flowing in an axial direction along a longitudinal axis of the purge port into the buffer chamber in a plurality of radial directions relative to the longitudinal axis, wherein the first flow enhancer comprises a frame that supports a first cap at a first elevation vertically above the purge port.

17. The apparatus of claim 16, wherein:
the buffer chamber comprises a peripheral wall that interfaces with the plurality of process chambers,
a center region of the buffer chamber is defined by the peripheral wall, and
the purge port is positioned within the center region.

18. The apparatus of claim 17, wherein the wafer positioning robot is positioned, at least partially, within the center region.

19. The apparatus of claim 16, wherein:
the first cap comprises a circular footprint, and
a ratio of a radius of the circular footprint of the first cap to a height of the frame is at least 1.0, and up to 4.0.

20. The apparatus of claim 16, wherein:
the purge port comprises an arcuate wall defining a circular aperture,
the first cap comprises a circular footprint, and
a ratio of a radius of the circular footprint of the first cap to a radius of the circular aperture of the purge port is at least 0.5, and up to 5.

* * * * *